(12) United States Patent
Huang et al.

(10) Patent No.: US 6,577,020 B2
(45) Date of Patent: Jun. 10, 2003

(54) HIGH CONTRAST ALIGNMENT MARKS HAVING FLEXIBLE PLACEMENT

(75) Inventors: Chun-Yen Huang, Chu-Bei (TW); Chien-Ye Lee, Taipei (TW); Ju-Bin Fu, Hsinchu (TW); Rong-I Peng, Miaoli (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/976,878

(22) Filed: Oct. 11, 2001

(65) Prior Publication Data

US 2003/0071369 A1 Apr. 17, 2003

(51) Int. Cl.[7] .................... H01L 23/544; H01L 21/301
(52) U.S. Cl. .................. 257/797; 438/401; 438/462; 438/975
(58) Field of Search .................. 257/797, 750, 257/765, 762, 763; 438/401, 975, 462

(56) References Cited

U.S. PATENT DOCUMENTS 5,898,227 A * 4/1999 Geffken et al. ............. 257/797
6,005,295 A * 12/1999 Hattori ...................... 257/750

OTHER PUBLICATIONS

Ohring, Milton; The Materials Science of Thin Films (1992), Academic Press Inc., pp. 227–232.*

* cited by examiner

Primary Examiner—Carl Whitehead, Jr.
Assistant Examiner—David L. Hogans
(74) Attorney, Agent, or Firm—Tung & Associates

(57) ABSTRACT

High contrast alignment marks that can be flexibly located on a semiconductor wafer are disclosed. The wafer has a first layer and a second layer. The first layer has a light-dark intensity and a reflectivity. The second layer is over the first layer, and has a light-dark intensity substantially lighter than that of the first layer, and a higher reflectivity than that of the first layer. The first layer may be patterned to further darken it. The second layer contrasts visibly to the first layer, and is patterned to form at least one or more alignment marks within the second layer. The first layer may be a metallization layer, such as titanium nitride, whereas the second layer may be a metallization layer, such as aluminum or copper.

11 Claims, 8 Drawing Sheets

HIGH CONTRAST ALIGNMENT MARKS HAVING FLEXIBLE PLACEMENT

FIELD OF THE INVENTION

This invention relates generally to semiconductor processing, and more particularly to the placement of alignment marks for subsequence use in conjunction with such processing.

BACKGROUND OF THE INVENTION

Semiconductor fabrication is a complex and expensive process. Complicated circuits are designed and fabricated at the sub-micron level, with tens of thousands or more of individual semiconductor transistors. The failure of only a small number of these transistors, however, can render a semiconductor device defective. Instead of relegating such defective devices to scrap, semiconductor manufacturers frequently try to first repair them, to recoup their investment as much as possible. The yield of operative semiconductor devices to the total number of devices fabricated can determine whether a manufacturer is profitable. As the yield increases, the manufacturer's unit costs decrease.

Repair is especially important in semiconductor memories. A semiconductor memory may have redundant rows or columns that can be logically replaced for rows or columns that have defective memory cells. The replacement is made by precision tools that take wafer probe failure data, locate the failed element, and use a laser to perform microsurgery on links to remove the defective element and connect a replacement in its place. Laser processing for repair of such memories involves complex thermal and mechanical coupled mechanisms. Although carrying spare elements on a die adds cost overhead, yields can be improved through repair by as much as tens of percent, justifying this added overhead.

For laser and other repair of semiconductor memories and other semiconductor devices, masks, and reticles, as well as for other aspects of semiconductor processing, such as lithography and deposition, alignment is important. For instance, if layers are not deposited properly, or if they are not selectively removed properly, the resulting semiconductor devices may not function, relegating them to scrap, which can be costly. Therefore, alignment marks are placed on the semiconductor wafer for the proper positioning during the deposition and photolithography processes. In the context of semiconductor device repair, alignment marks serve to guide the repair process. For instance, a laser may focus on the alignment marks, or otherwise utilize them so that repair is properly accomplished.

In FIG. 1, a semiconductor wafer 102 is shown that has alignment marks, such as the alignment square 104, thereon. When a photomask 106 is positioned over the wafer 102, its own alignment marks, such as the alignment square 108, is aligned with the alignment marks of the wafer 102. For example, the alignment square 108 of the photomask 106 is aligned so that the alignment square 104 of the wafer 102 is centered therein. The alignment marks of the semiconductor wafer 102 are located in the individual dies, or devices, of the wafer 102. This is disadvantageous, because chip area is increased without a corresponding increase in device functionality or storage. Furthermore, where a design has already been finalized for fabrication, which is known as tape out, it is difficult to subsequently add alignment marks within the devices themselves.

In other types of semiconductor processing, alignment marks are placed in two fields, or areas, on opposite edges of the semiconductor wafer. In FIG. 2, a wafer 200 is divided into a number of fields, such as the field 202. Each field corresponds to one or more semiconductor devices, and represents an area of the wafer that will be processed at a given time. For instance, a stepper may first process one field, then move on to the next field, and so on. The wafer 200 has an upper-right field 204 and a lower-left field 206 that have alignment marks 208 and 210, respectively. The presence of the marks 208 and 210 on the fields 204 and 206 presents difficulties with semiconductor processing of these fields, however. The alignment marks 208 and 210 should not be obscured, so that proper alignment for subsequent processing can still occur. The marks 208 and 210 also increase chip area of the individual dies in which they are located.

Another approach to alignment mark placement is to locate the marks within the scribe lines that separate the individual dies on a wafer. In FIG. 3, a semiconductor wafer 302 on which patterns such as alignment marks can be placed is shown. The wafer 302 has a number of semiconductor device areas, such as the areas 304 and 306. Each device area of the wafer 302 is for a separate device to be fabricated. The device areas themselves may also be referred to as chips, dies, devices, circuits, microchips, and bars. They are used to identify the microchip patterns covering the majority of the surface of the wafer 302. Scribe lines, such as the scribe lines 308 and 308, separate the device areas. The scribe lines are also referred to as saw lines, streets, and avenues, and are the spaces between the chips that allow separation of the chip from the wafer.

Locating the alignment marks within the scribe lines does not increase chip area, but unfortunately this approach has other disadvantages. Overlay patterns, photo alignment keys, critical dimension bars, test lines, and other patterns are commonly already included in the scribe lines, limiting where the alignment marks can be placed, since they cannot be placed on these patterns. For semiconductor memories in particular, desirably each die has at least one alignment mark, and preferably has three alignment marks, such that placing the marks in the scribe lines is difficult to accomplish with the other patterns already occupying the lines.

There fore, there is a need for an alignment mark that can be more flexibly placed within semiconductor dies. Such an alignment mark should avoid the location difficulties associated with placing such marks on scribe lines. Such an alignment mark should also desirably not decrease the chip area of a given die. For these and other reasons, there is a need for the present invention.

SUMMARY OF THE INVENTION

The invention relates to high contrast alignment mark s that can be flexibly located on a semiconductor wafer. The wafer has a first layer and a second layer. The first layer has a light-dark intensity and a reflectivity. The second layer is over the first layer, and has a light-dark intensity substantially lighter than that of the first layer, and a higher reflectivity than that of the first layer. The first layer may be patterned to further darken it. The second layer contrasts visibly to the first layer, and is patterned to form at least one or more alignment marks within the second layer. The first layer may be a metallization layer, such as titanium nitride, whereas the second layer may be a metallization layer, such as aluminum or copper.

The invention provides for advantages over the prior art. The high reflectivity of the second layer as compared to the low reflectivity of the first layer means that the alignment marks patterned in the second layer have increased visibility. Furthermore, the first and second layers can be added even on top of a die, giving added flexibility in placement of the alignment marks. Three alignment marks may be added per die using the invention, which is the preferred number for semiconductor memories. Chip size does not increase where the alignment marks are added to the top of a die, and the alignment marks may be added even where a die design has already been finalized at tape out. Semiconductor memories employing the invention can be repaired at a high rate, ensuring a high yield.

Still other aspects, embodiments, and advantages of the invention will become apparent by reading the detailed description and by referring to the accompanying drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
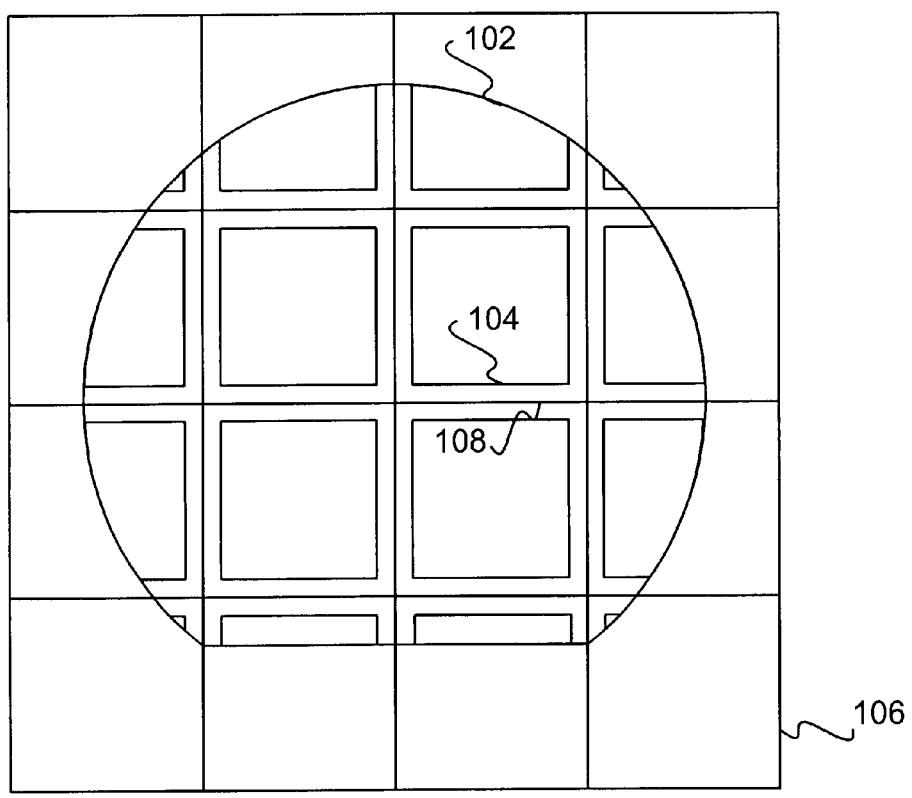
FIGS. 1, 2, and 3 show example alignment marks that can be placed on semiconductor wafers.
Figure 2:
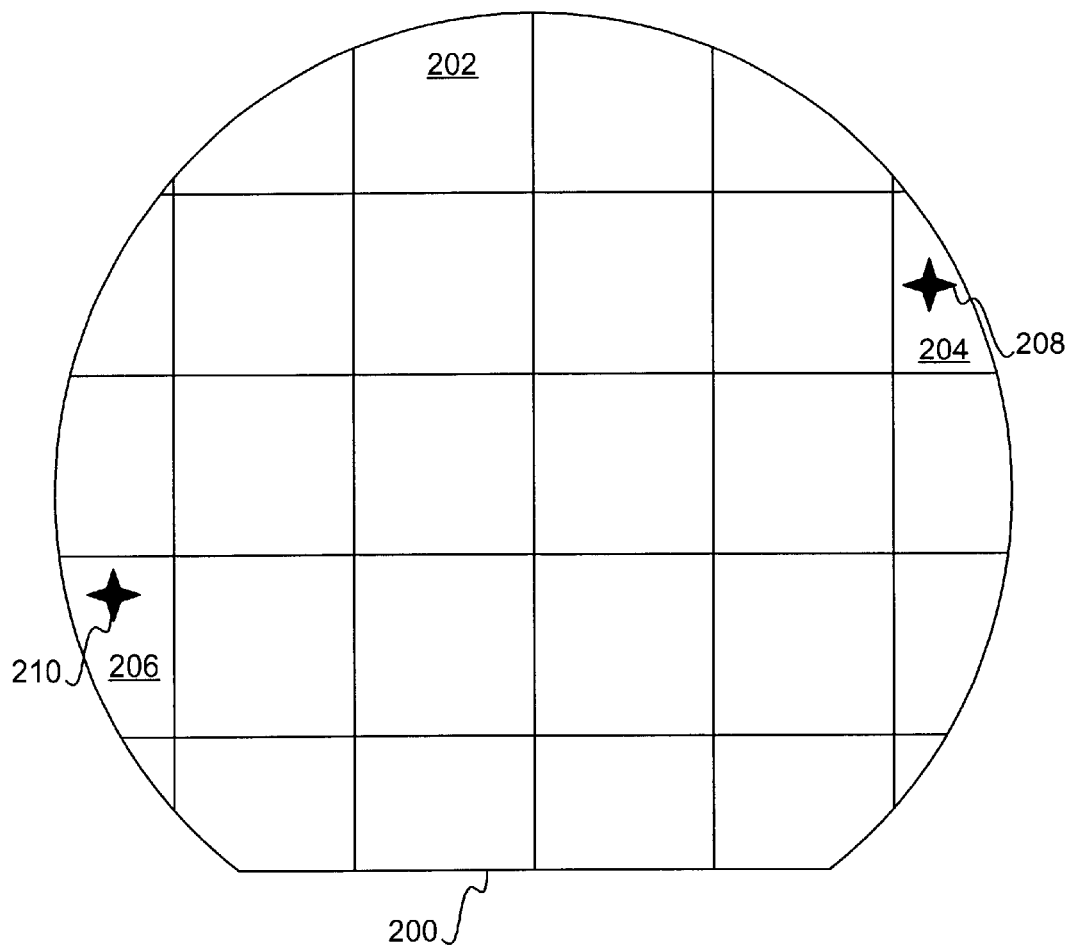
Figure 3:
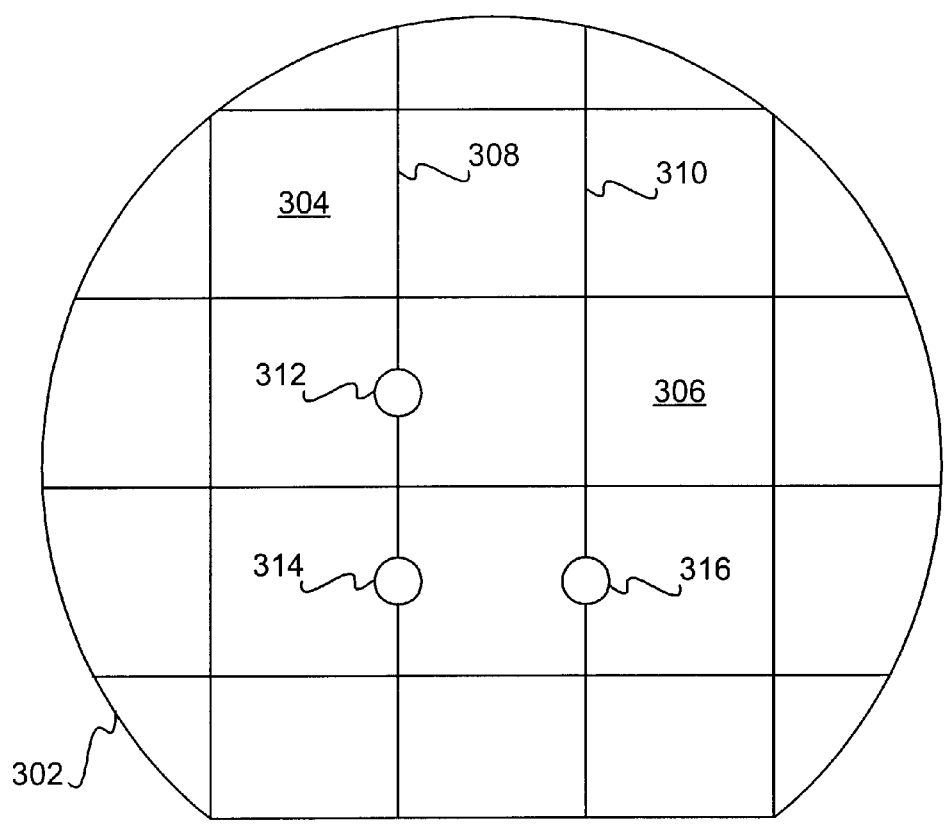
Figure 4:
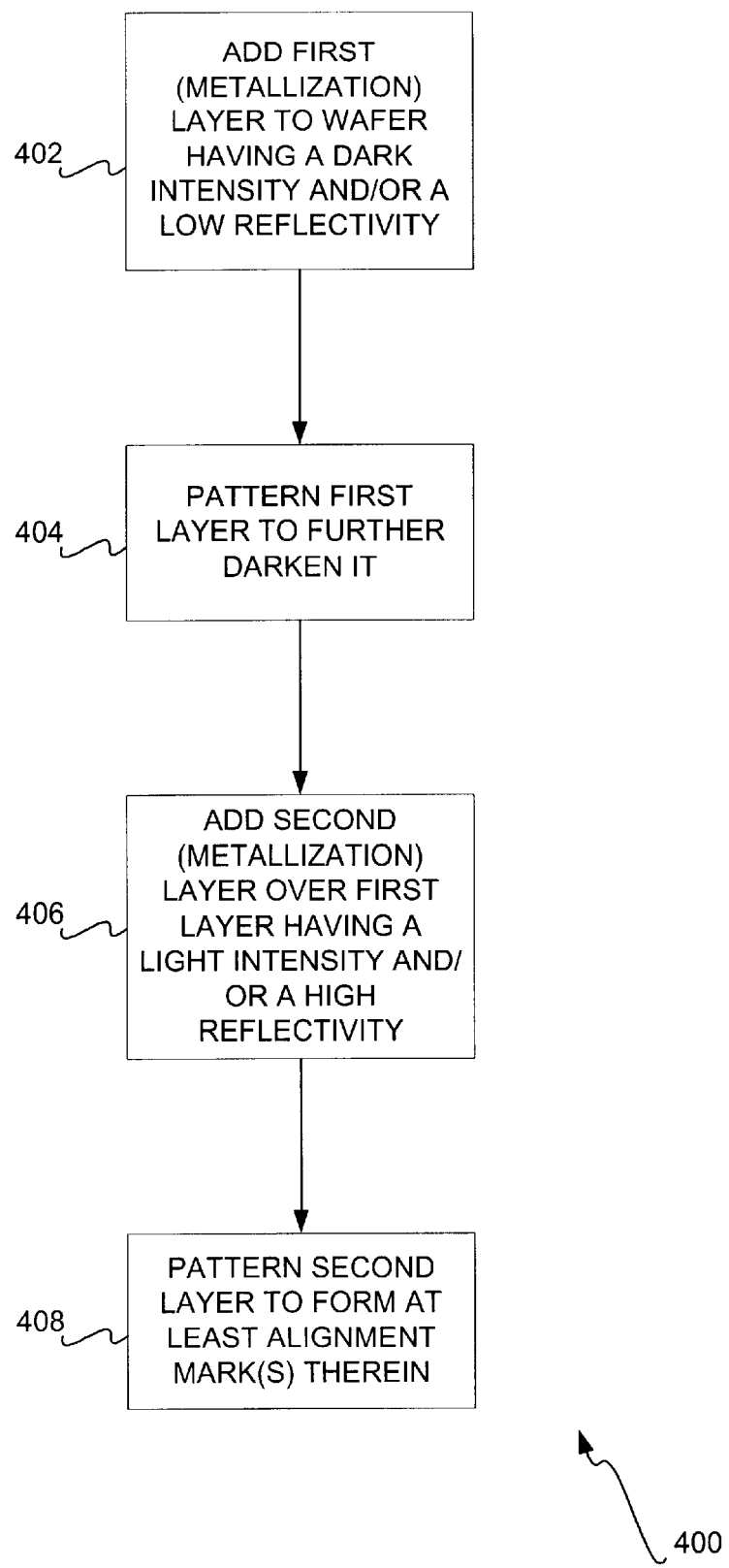
FIG. 4 is a method according to an embodiment of the invention.

FIG. 4 shows a method 400 according to which one embodiment adds alignment marks to a semiconductor wafer having one or more semiconductor dies. The method 400 may be performed after other semiconductor processing has already been performed, and further semiconductor processing may be performed after the performance of the method 400. A first layer is added to the wafer that has a dark intensity and/or a low reflectivity (402). The first layer may be a metallization layer, such as titanium nitride. The light-dark intensity of the first layer is such that it provides a dark background with low reflectivity. The first layer may be added by a deposition process. The first layer is desirably a relatively thick layer.

The first layer is then optionally patterned to further darken it (404). The patterning may define a background for the alignment marks that will be subsequently added. The background of the first layer is desirably dark and/or has low reflectivity so that the subsequently formed alignment marks will be more easily visible against the background. Patterning may be accomplished according to known photolithographic techniques.

A second layer is added to the wafer over the first layer (406). The second layer has a light intensity and/or a high reflectivity. That is, it has a substantially greater reflectivity than that of the first layer, and has a light-dark intensity substantially lighter than the light-dark intensity of the first layer. As a result, the second layer has increased visibility when viewed against the first layer, and visibly contrasts relative to the first layer. The second layer may also be a metallization layer, such as aluminum or copper. The second layer may be added by a deposition process, such as via sputtering.

The second layer is finally patterned to form at least one or more alignment marks within the second layer (408). The alignment marks may be patterned via known photolithographic techniques. The resulting alignment marks have increased visibility, since they are formed out of the highly reflective, lightly colored second layer, and are viewed against the lowly reflectively, darkly colored first layer. The alignment marks visibly contrast to the alignment background of the first layer. The patterning that forms the alignment marks may also be used to form features of the semiconductor device that is the intended purpose of the semiconductor die.

Figure 5:
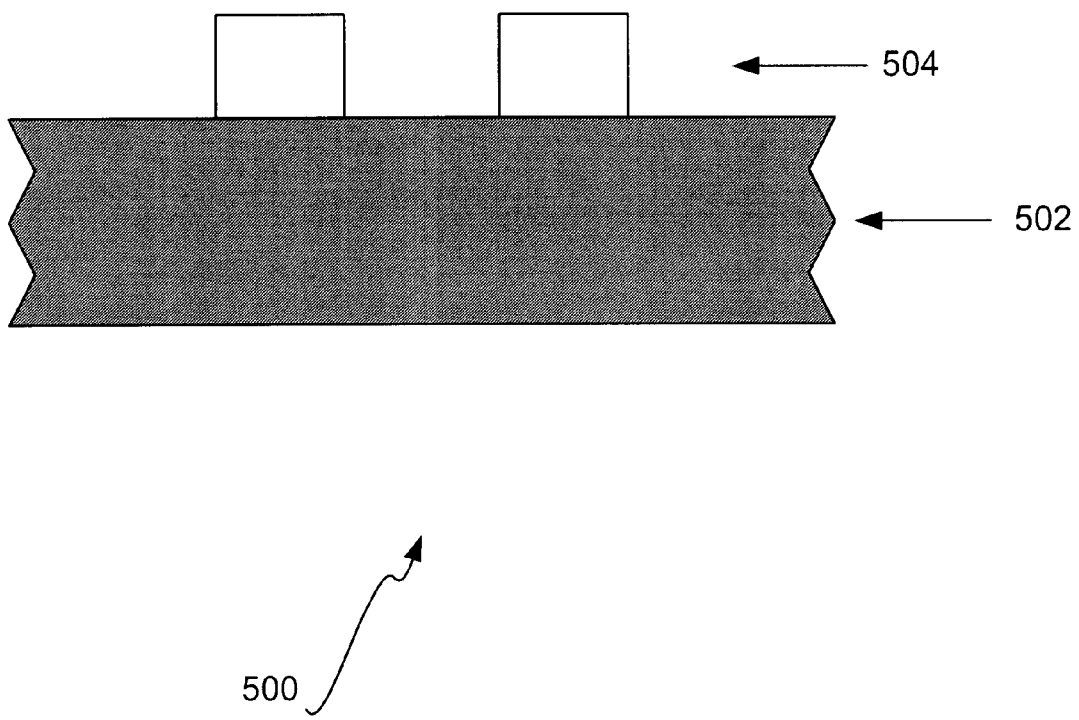
FIG. 5 is a diagram of a semiconductor device having alignment marks according to an embodiment of the invention.

FIG. 5 shows part of a semiconductor device 500 on which there are alignment marks according to an embodiment of the invention. The first layer 502 is a metallization layer that has been patterned to form an alignment background that is relatively dark and that has relatively low reflectivity. The layer 502 may be titanium nitride. The second layer 504 is added to the first layer 502. The second layer 504 is also a metallization layer, but has been patterned to form alignment marks thereon. The second layer 504 is relatively light and has relatively high reflectivity, and may be copper or aluminum. The alignment marks formed in the second layer 504 have high contrast relative to the first layer 502, and thus have increased visibility against the first layer 502.

Figure 6A:
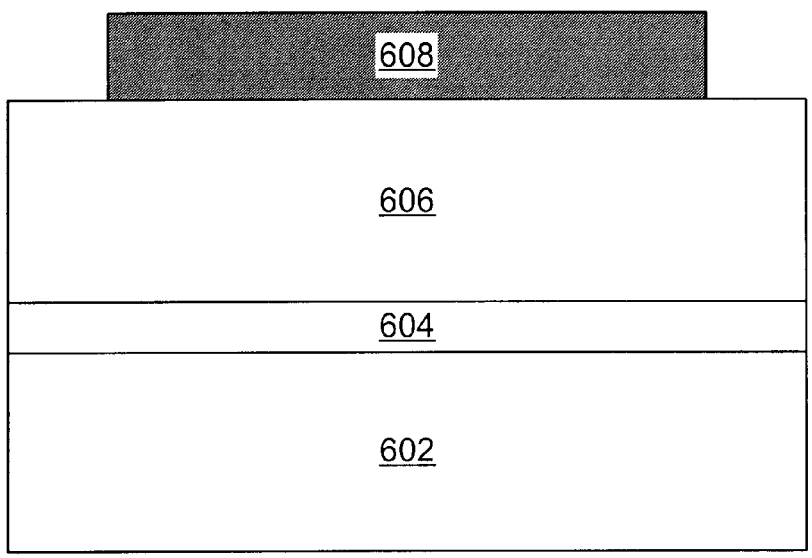
FIGS. 6A and 6B are diagrams of a semiconductor memory device having alignment marks according to an embodiment of the invention, where the memory device of FIG. 6A has alignment marks added thereto as shown in FIG. 6B.
Figure 6A:
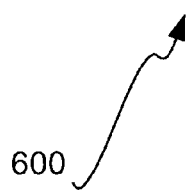
Figure 6B:
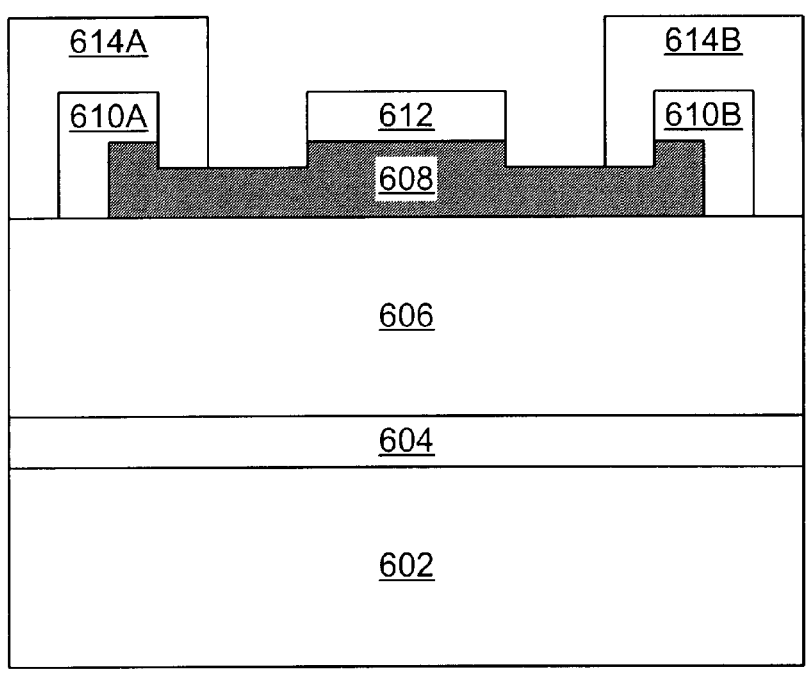

FIGS. 6A and 6B show the two actions that are used to add alignment marks on a semiconductor memory device according to an embodiment of the invention. In FIG. 6A, the memory device 600 has a first metallization layer 602, with an anti-reflective coating (ARC) 604 added thereon. An inter-metallization dielectric (IMD) 606 separates the second metallization layer 608 from the first metallization layer 602. The second metallization layer 608 is patterned to form the alignment background as has been described, having low reflectivity and which is relatively dark.

In FIG. 6B, the memory device 600 has deposited thereon a third metallization layer 612, in which is patterned the alignment marks, as has been described, such that the layer 612 has high reflectivity and is relatively light. The etching that results from patterning the layer 612 also etches some of the layer 608, such that the alignment marks have high contrast relative to the layer 608, and such that the marks 612 have increased visibility against the layer 608. Also shown in FIG. 6B are guard rings 610A and 610B, and passivation layers 614A and 614B. There may be one or more additional metallization layers beneath the first metallization layer 602, such that adjacent metallization layers are separated by an IMD, such as silicon dioxide, and optionally an ARC.

Figure 7:
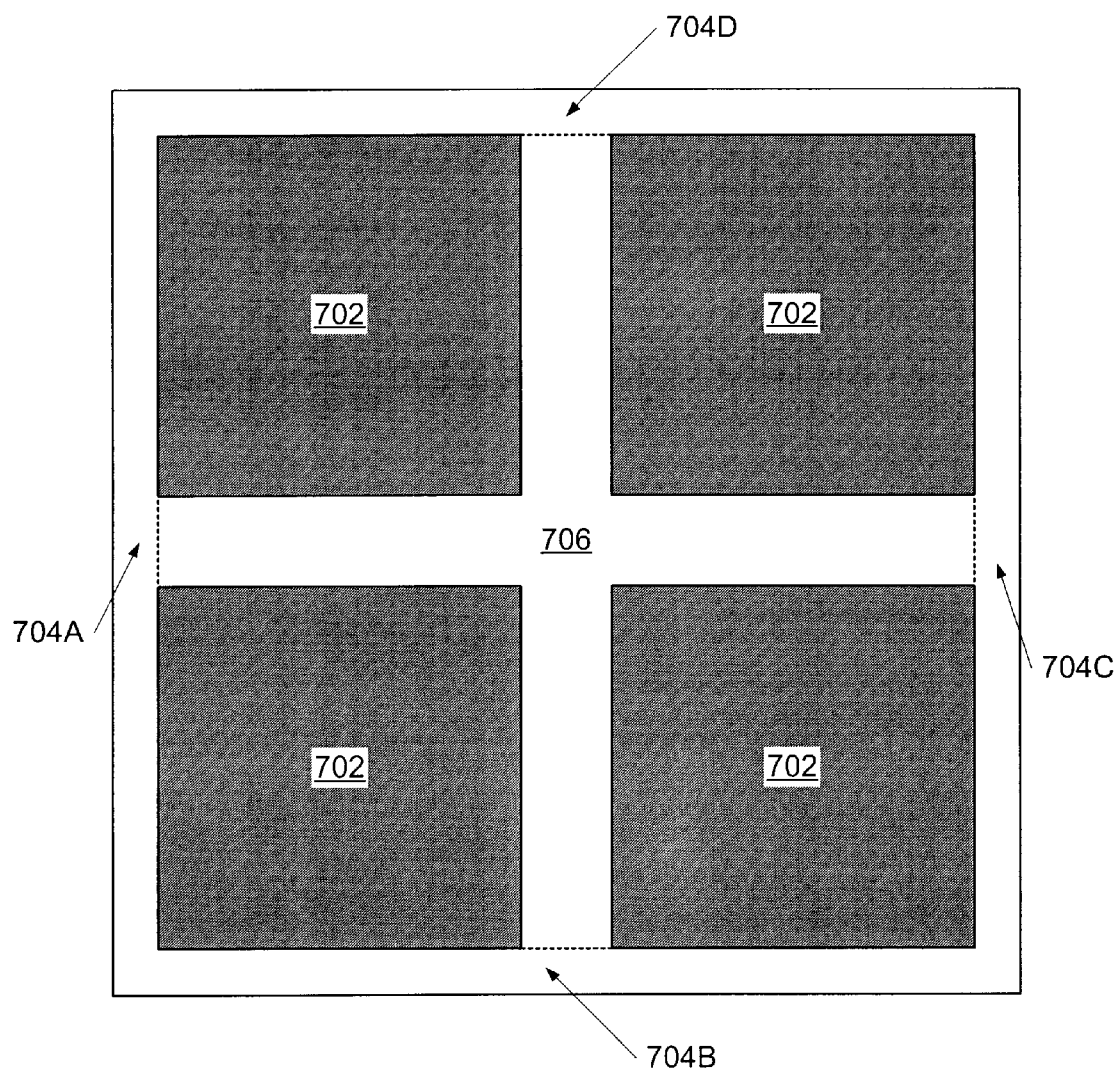
FIG. 7 is a diagram showing a top view of alignment marks on a semiconductor device, according to an embodiment of the invention.

FIG. 7 shows a top view of a semiconductor device 700 on which alignment marks have been formed according to an embodiment of the invention. The layer 702 is a metallization layer that has low reflectivity and is relatively dark. The layer 702 is thus the alignment background. Highly visible against the layer 702 are the alignment marks 706A, 706B, 706C, and 706D, which are formed from another metallization layer that has high reflectivity and is relatively light. The marks 706A, 706B, 706C, and 706D thus have high contrast as compared to the layer 702. Also shown in FIG. 7 are guard rings 704A, 704B, 704C, and 704D.

The alignment marks 706A, 706B, 706C, and 706D may be placed on top of the device 700 itself. That is, the marks 706A, 706B, 706C, and 706D do not have to be a part of the design of the device 700, as may have been finalized at tape out. Instead, the marks 706A, 706B, 706C, and 706D can be added to the top of the device 700, allowing their placement to be highly flexible. This also means that they do not increase chip size, such that device yield for a given wafer is not reduced by using the alignment marks 706A, 706B, 706C, and 706D.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A semiconductor device comprising:
   a first metallization layer having a dark photolithographic pattern acting as an alignment background;
   a second metallization layer provided over the first metallization layer, the second metallization layer visibly contrasting relative to the dark photolithographic pattern of the first metallization layer; and,
   at least one alignment mark patterned in the second metallization layer.

2. The device of claim 1, wherein the at least one alignment mark has increased visibility as patterned in the second layer when viewed against the first layer.

3. The device of claim 1, wherein the first metallization layer includes titanium nitride.

4. The device of claim 1, wherein the second metallization layer includes one of aluminum and copper.

5. The device of claim 1, further comprising:
   a third metallization layer beneath the first metallization layer; and
   an inter-metallization dielectric between the third metallization layer and the first metallization layer.

6. The device of claim 5, further comprising:
   a fourth metallization layer beneath the third metallization layer; and
   a second inter-metallization dielectric between the fourth metallization layer and the third metallization layer.

7. A device of claim 1, wherein the device is a memory device.

8. A semiconductor device formed at least in part by a method comprising:
   adding a first layer having a reflectivity;
   photolithographically patterning the first layer so that the first layer has a dark photolithographic pattern acting as an alignment background;
   adding a second layer over the first layer having a reflectivity substantially greater than the reflectivity of the first layer, at least due to the first layer having the dark photolithographic pattern; and,
   patterning the second layer to at least form the at least one alignment mark.

9. The semiconductor device of claim 8, wherein the at least one alignment mark has increased visibility as formed in the second layer when viewed against the first layer.

10. The semiconductor device of claim 8, wherein the first layer includes titanium nitride, and the second layer includes one of aluminum and copper.

11. The semiconductor device of claim 8, wherein the device is a memory device.

* * * * *